(12) United States Patent
Kim

(10) Patent No.: US 7,276,452 B2
(45) Date of Patent: Oct. 2, 2007

(54) METHOD FOR REMOVING MOTTLED ETCH IN SEMICONDUCTOR FABRICATING PROCESS

(75) Inventor: Hyung Seok Kim, Seo-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,728

(22) Filed: Dec. 30, 2004

(65) Prior Publication Data

US 2005/0153568 A1 Jul. 14, 2005

(30) Foreign Application Priority Data

Dec. 31, 2003 (KR) .................. 10-2003-0101986

(51) Int. Cl.
*H01L 21/302* (2006.01)
*H01L 21/461* (2006.01)

(52) U.S. Cl. .................. 438/734; 257/E21.026; 438/750; 438/963

(58) Field of Classification Search .............. 438/734, 438/750, 725, 963, 906, 948; 257/E21.025, 257/E21.026
See application file for complete search history.

(56) References Cited

U.S. PATENT DOCUMENTS

| | | | | |
|---|---|---|---|---|
| 4,861,424 A | * | 8/1989 | Fujimura et al. | 216/67 |
| 6,432,618 B1 | * | 8/2002 | Hui et al. | 430/311 |
| 6,498,106 B1 | * | 12/2002 | Hsin et al. | 438/704 |
| 2002/0068376 A1 | * | 6/2002 | Hsieh | 438/98 |
| 2005/0199262 A1 | * | 9/2005 | Jeon et al. | 134/1.1 |

FOREIGN PATENT DOCUMENTS

JP 63-102251 * 5/1998 ............. 438/396

* cited by examiner

*Primary Examiner*—Caridad Everhart
(74) *Attorney, Agent, or Firm*—Lowe Hauptman & Berner LLP

(57) ABSTRACT

A method for removing mottled etch in a semiconductor fabricating process, prevents mottled etch from being generated after etching, by performing ashing using an oxide plasma, prior to performing wet etching using a photoresist pattern. The method for removing the mottled etch includes the steps of forming a gate oxide film on a semiconductor substrate; forming a photoresist pattern on the substrate; performing ashing using an oxygen plasma; and removing the oxide film consequently by wet etching, the oxide film being opened by the pattern.

2 Claims, 3 Drawing Sheets

METHOD FOR REMOVING MOTTLED ETCH IN SEMICONDUCTOR FABRICATING PROCESS

BACKGROUND OF THE INVENTION

1. Field of the Invention

The present invention relates to a method for removing a mottled etch in a semiconductor fabricating process, and more particularly, to a method for preventing mottled etch from being generated after etching, by performing ashing using an oxide plasma, prior to performing wet etching using a photoresist pattern.

2. Discussion of the Related Art

In general, a process for fabricating an oxide film provided in a high voltage semiconductor device includes the steps of depositing a high voltage gate oxide film, forming a photoresist pattern, and performing wet etch. In other words, the gate oxide film pattern is formed by performing wet etching using the photoresist pattern as an etch mask. In this instance, buffered hydrofluoric acid (BHF) is normally used as an etch solution. However, in the process of removing the oxide film using the etch solution, the solution reacts to the photoresist or oxide film and changes into a hydrophilic or hydrophobic solution.

When the etch solution changes into the hydrophobic solution, a wetting angle on a surface is increased by the hydrophobic reaction, and a bubble phenomenon of the etch solution results, whereby a mottled etch or a blue spot occurs.

FIG. 1 illustrates a microphotograph showing a mottled etch with various patterns on a surface of the semiconductor device. The mottled etch acts as a partial obstacle so as to form an inconsistent oxide film, or reacts to the air so as to contaminate an oxide film. If the mottled etch is not removed, problems are occurred in many subsequent processes such as ion implantation, thereby lowering the performance characteristic of the semiconductor device.

SUMMARY OF THE INVENTION

Accordingly, the present invention is directed to a method for removing mottled etch in a semiconductor fabricating process that substantially obviates the above-identified problems due to limitations and disadvantages of the related art.

An object of the present invention is to provide a method for preventing mottled etch from being generated after etching, by performing ashing using an oxide plasma, prior to performing wet etching using a photoresist pattern.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for removing the mottled etch includes the steps of forming a gate oxide film on a semiconductor substrate; forming a photoresist pattern on the substrate; performing ashing using an oxygen plasma; and removing the oxide film by wet etching, the oxide film being opened by the pattern.

First of all, a high voltage gate oxide film is deposited on the semiconductor substrate. A photoresist is coated, and a pattern for opening the oxide surface is formed, the oxide film to be removed by etching. Then, prior to wet etching, ashing is performed using oxide plasma. Therefore, when the oxide film being in contact with the etch solution is treated with oxygen prior to the wet etching, an effect is achieved that the etch solution is prevented from being changed into a hydrophobic solution by intensifying oxidizing reaction during the wet etching.

Therefore, the mottled etch occurred after etching in the related art is avoided and a clean surface is obtained.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
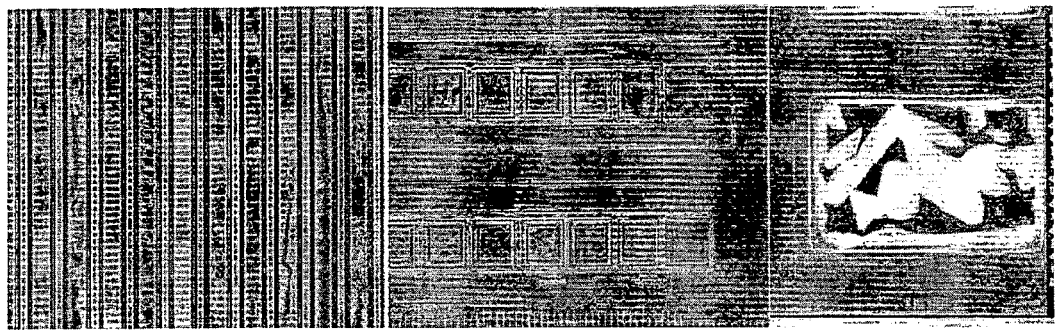
FIG. 1 illustrates a microphotograph showing mottled etch on a semiconductor device in accordance with a related art.
Figure 2A:
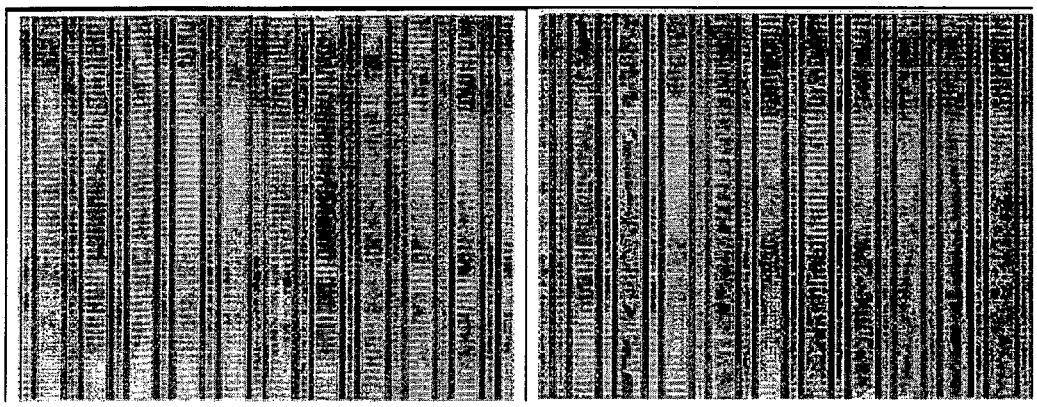
FIG. 2A illustrates a microphotograph showing mottled etch removed from the semiconductor substrate in accordance with the present invention.

FIG. 2A illustrates a microphotograph showing a first surface of a semiconductor device when wet etching is performed after oxygen plasma ashing is performed (left photo), and a second surface thereof when wet etching is performed without performing the oxygen plasma ashing (right photo).

In the left photo, there is no evidence of a mottled etch and the semiconductor surface is clean. The oxygen plasma ashing is performed at a microwave type photoresist remover. In this instance, the condition is as follows.

Figure 2B:
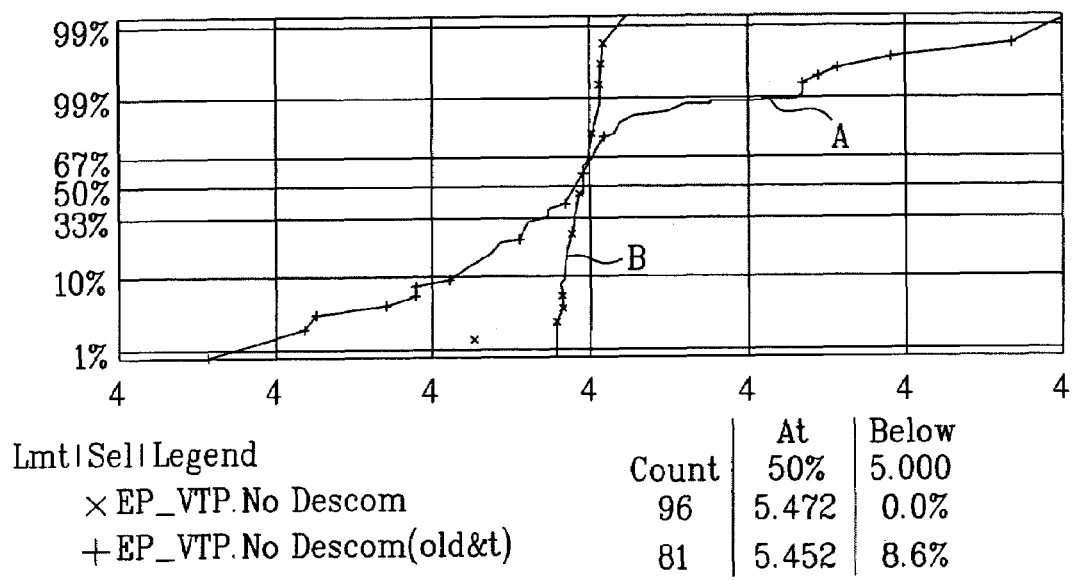
FIG. 2B illustrates a graph showing an electric characteristic of the semiconductor device from which mottled etch is removed by the present invention.

1. Pressure: 1 to 2 Torr
2. Temperature: 80 to 150° C.
3. Power: 1000 to 2000 W power
4. Amount of oxygen: 300 to 3000 scm
5. H2N2: 3000 to 2000 scm
6. Hour: 20 to 15 sec FIG. 2B illustrates a graph showing a DC measurement of an electrically erasable programmable read-only memory (EEPROM) applied in the high voltage gate oxide process for understanding an adverse effect caused by the mottled etch. An outcome indicated as A is a graph of the semiconductor device from which the mottled etch is not removed. It is understood that Vth is moved, compared to that of the semiconductor from which the mottled etch is removed. In other words, the characteristic of the semiconductor is improved by performing the oxygen plasma ashing.

This application claims the benefit of Korean patent Application No. P2003-01986, filed on Dec. 31, 2003, the entire contents of which is hereby incorporated by reference as if fully set forth herein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

Accordingly, the method for removing the mottled etch in the semiconductor fabricating process in accordance with the present invention has an effect of preventing the mottled etch from being generated after etching, by performing ashing using the oxygen plasma prior to wet etching.

What is claimed is:

1. A method for removing mottled etch in a semiconductor fabricating process, comprising the steps of:
   forming a gate oxide film on a semiconductor substrate;
   forming a photoresist pattern on the gate oxide film to expose a portion of the gate oxide film;
   supplying oxygen to the exposed portion of the gate oxide film;
   applying power to the supplied oxygen at a temperature of 80 to 150° C. to perform surface treatment on the exposed portion of the gate oxide film; and
   removing the exposed portion of the gate oxide film by wet etching using the photoresist pattern as a mask.

2. The method of claim 1, wherein the surface treatment step includes the steps of applying the oxygen plasma in an environment having a pressure of 1 to 2 Torr, and a power of 1000 to 2000 W, and spilling the oxygen of 300 to 3000 sccm and H2N2 of 300 to 2000 sccm for between 2 and 15 seconds.

* * * * *